(12) United States Patent
Katsumata et al.

(10) Patent No.: US 7,025,623 B2
(45) Date of Patent: Apr. 11, 2006

(54) ADAPTER FOR MEMORY CARD

(75) Inventors: Akira Katsumata, Tokyo (JP); Hirotaka Nishizawa, Tokyo (JP); Kenji Osawa, Tokyo (JP)

(73) Assignees: Sanwa Denki Kogyo Co., Ltd., Tokyo (JP); Renesas Technology Corp., Tokyo (JP)

( * ) Notice: Subject to any disclaimer, the term of this patent is extended or adjusted under 35 U.S.C. 154(b) by 0 days.

(21) Appl. No.: 10/812,988

(22) Filed: Mar. 31, 2004

(65) Prior Publication Data
US 2004/0235353 A1 Nov. 25, 2004

(30) Foreign Application Priority Data
May 23, 2003 (JP) ............................. 2003-146331

(51) Int. Cl.
*H01R 13/00* (2006.01)
(52) U.S. Cl. ...................................... 439/483; 361/737
(58) Field of Classification Search ............ 439/476.1, 439/483; 361/737; 238/492
See application file for complete search history.

(56) References Cited

U.S. PATENT DOCUMENTS

| | | | | |
|---|---|---|---|---|
| 5,339,222 A | * | 8/1994 | Simmons et al. | 361/818 |
| 5,901,049 A | * | 5/1999 | Schmidt et al. | 361/787 |
| 6,181,564 B1 | * | 1/2001 | Furusho | 361/737 |
| 6,417,444 B1 | * | 7/2002 | Hirai et al. | 174/35 R |
| 6,817,533 B1 | * | 11/2004 | Chen | 235/492 |
| 6,858,925 B1 | * | 2/2005 | Wada et al. | 257/679 |
| 6,865,086 B1 | * | 3/2005 | Gochnour et al. | 361/737 |

* cited by examiner

*Primary Examiner*—Thanh-Tam Le
(74) *Attorney, Agent, or Firm*—Rabin & Berdo, P.C.

(57) ABSTRACT

An adapter for a memory card having a frame metal fitting to which an end portion of the card is inserted, whereby the card is detachably fitted, and a resin-molded body core assembled in the frame metal fitting by insertion, wherein an entire thickness of the adapter being approx. the same as that of the card, the frame metal fitting having a pair of holding portions in an approx. C shape in both end portions on the side of the card attached to hold both sides of the card, a hook portion between a pair of the holding portions being detachably engaged with the end portion of the card by spring force to prevent the card from coming off, a caulking projection fixing the core by caulking to the core, and an insulative coating film formed on the outer surface of the frame metal fitting.

18 Claims, 16 Drawing Sheets

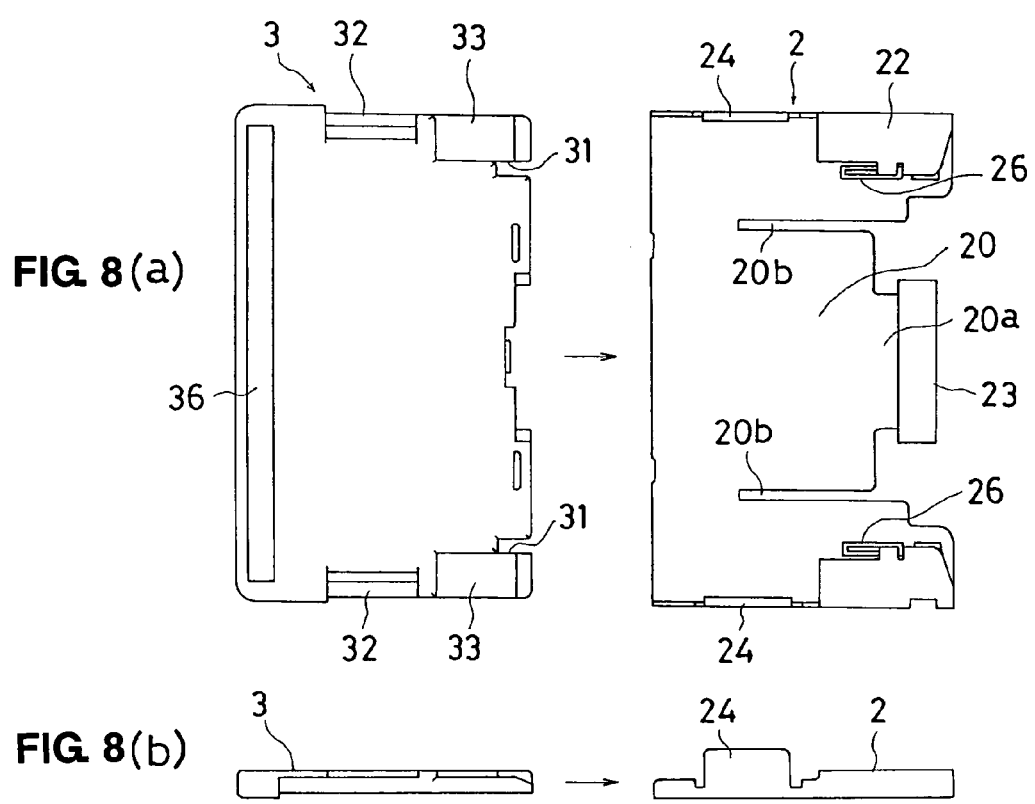

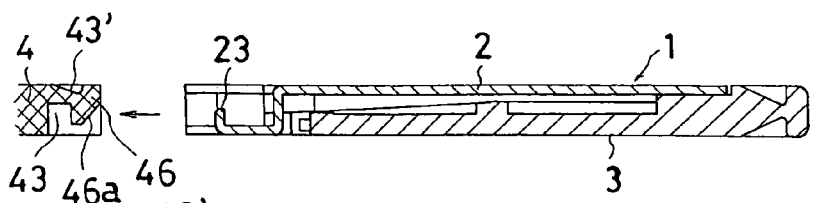
FIG. 19(a)
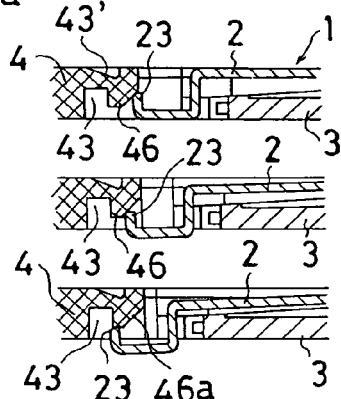
FIG. 19(b)
FIG. 19(c)
FIG. 19(d)
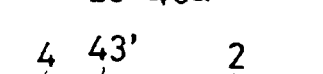
FIG. 19(e)
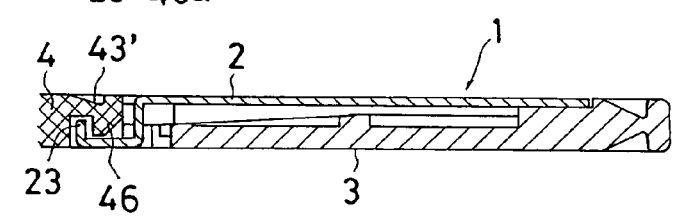
FIG. 20
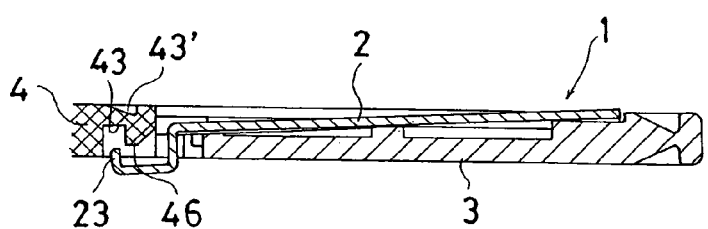
FIG. 21
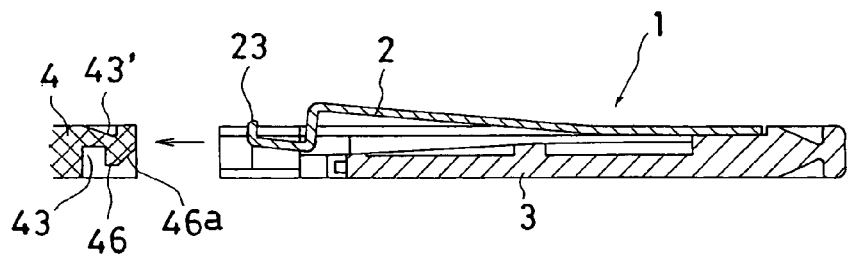

ADAPTER FOR MEMORY CARD

BACKGROUND OF THE INVENTION

1. Field of the Invention

The present invention relates to an adapter to which a memory card, particularly, a compact memory card such as RS-MMC or the like is attached, whereby a variation of an electronic equipment capable of using the memory card can be widened.

2. Description of the Conventional Art

As available memory cards in the market, there are an ATA (PC) card, a smart media card, a CF card, an MMC (registered trade mark) and the like. On the other hand, there is a recently developed RS (reduced size)-MMC (registered trade mark) in which a thickness is equal to that of the MMC, however, a width and a depth (a length) are about a half thereof respectively. The RS-MMC has the same specification as that of the MMC, and can be used for the electronic equipment such as a computer or the like and a cellular phone as an alternative of the MMC.

However, the RS-MMC is compact, and can not be used in a computer and an external driver capable of using the other memory cards such as the MMC and the like. Accordingly, in the present circumstances, the RS-MMC can be used only in the computer and the external driver made for exclusive use of the RS-MMC. Thus, there is a problem that the range of electronic equipments in which the compact memory card such as the RS-MMC or the like can be used is limited.

SUMMARY OF THE INVENTION

The present invention is made by taking the problem mentioned above into consideration, and an object of the present invention is to provide an adapter for a memory card, to which a compact memory card such as an RS-MMC or the like is attached, whereby it is possible to use in an electronic equipment made for use of a normal size memory card such as an MMC or the like, so that it is possible to widen a usable range of the compact memory card.

In order to achieve the object mentioned above, in accordance with a first aspect of the present invention, there is provided an adapter for a memory card comprising:

a frame metal fitting to which an end portion of the memory card is inserted, whereby the memory card is detachably fitted; and a core formed of a resin molded body, which is assembled in the frame metal fitting by insertion, wherein an entire thickness of the adapter is approximately the same as a thickness of the memory card, the frame metal fitting has a pair of holding portions which are formed in an approximately C shape in both end portions on the side of the memory card being attached and hold both sides of the memory card on the basis of insertion of the memory card, a hook portion which is provided between a pair of the holding portions and is detachably engaged with the end portion of the memory card by spring force so as to prevent the memory card from coming off, and a caulking projection which fixes the core on the basis of caulking to the core, and an insulative coating film is formed on the outer surface of the frame metal fitting.

In accordance with the invention described in the first aspect, the core is assembled in the frame metal fitting and the adapter for the memory card is formed, by inserting the core to the frame metal fitting and caulking the caulking projection. In this adapter, the holding portions hold both sides of the memory card by inserting the memory card into the frame metal fitting, and the hook portion is engaged with the memory card on the basis of the spring force so as to prevent the memory card from coming off, whereby the memory card is attached to the adapter.

In the state that the memory card is attached, the size of the combination of the memory card and the adapter is equal to the size of a normal size memory card. Further, the thickness of the adapter is approximately equal to the thickness of the memory card. Accordingly, since the same size as a normal size memory card is achieved in the state that the memory card is attached to the adapter, it is possible to use in the electronic equipment for a normal size memory card, so that it is possible to expand a usable range of the compact memory card.

Further, since the insulative coating film is formed on the outer surface of the frame metal fitting, a short-circuit does not occur between contact shoes of a connector even in the case that the adapter is erroneously attached to the connector. Accordingly, it is possible to prevent a relevant electronic equipment and the like from being broken and damaged.

In accordance with a second aspect of the present invention, there is provided an adapter for a memory card as recited in the first aspect, wherein a pair of the holding portions are formed in an approximately C shape so as to apply spring force for elastically holding the memory card, and a centering boss portion for centering the memory card is formed in at least one of the holding portions.

In accordance with the second aspect, since the holding portions hold the memory card on the basis of the spring force, it is possible to securely attach the memory card. Further, since the centering boss portion centers the memory card, it is possible to securely attach the memory card to a regular position.

In accordance with a third aspect of the present invention, there is provided an adapter for a memory card as recited in the first or second aspect, wherein a pair of the holding portions have an opening prevention piece for preventing the approximately C shape from opening on the basis of the engagement with the core.

In accordance with the third aspect, since the opening prevention piece is engaged with the core, thereby preventing the holding portions from opening, the frame metal fitting maintains a fixed thickness, and the entire thickness of the adapter is not increased. Accordingly, it is possible to securely attach to the electronic equipment. Further, since it is possible to securely hold the memory card by means of the holding portions, it is possible to prevent the memory card from falling away. Further, since the holding portions maintain the approximately C shape even in the case that the memory card is frequently attached and detached, it is possible to secure durability.

In accordance with a fourth aspect of the present invention, there is provided an adapter for a memory card as recited in any one of the first to third aspects, wherein end surfaces in the memory card insertion side of a pair of the holding portions are cut diagonally to the insertion direction.

In accordance with the diagonal cut of the holding portions mentioned above, no resistance is generated in the case that the memory card is regularly inserted, and great resistance is generated if the memory card is reversely inserted. Accordingly, it is possible to prevent reverse attachment of the memory card on the basis of a feeling at a time of inserting the memory card.

In accordance with a fifth aspect of the present invention, there is provided an adapter for a memory card as recited in any one of the first to fourth aspect, wherein a notch portion for forming a center of a relative rotation of the memory card with respect to the frame metal fitting on the basis of the engagement with the memory card is formed in at least one of a pair of the holding portions.

In accordance with the fifth aspect, since the memory card can be attached to the adapter by relatively rotating the memory card around the notch portion, it is possible to easily attach the memory card.

Further, in accordance with this invention, the structure may be made such that a locking projection corresponding to the notch portion is formed in one end portion of the memory card, whereby the locking projection and the notch portion are engaged so as to form the rotation center mentioned above. Accordingly, since the relative rotation of the memory card can be stably achieved, it is possible to further easily attach the memory card. Further, since a directionality at a time of attaching is applied by forming the locking projection in one end portion with respect to the memory card, it is possible to prevent the memory card from being reversely attached.

In accordance with a sixth aspect of the present invention, there is provided an adapter for a memory card as recited in the first aspect, wherein a displacement control portion for preventing the hook portion from being displaced in the direction apart from the core on the basis of relative contact is provided in the core and the hook portion.

In accordance with the sixth aspect, since it is possible to control so as to prevent the hook portion from moving apart from the core, the hook portion does not move apart from the core. Accordingly, an attitude of the hook portion with respect to the memory card is always constant, and it is possible to securely engage with the memory card by the hook portion.

In accordance with a seventh aspect of the present invention, there is provided an adapter for a memory card, wherein an insulative coating film is formed in the entire of the outer surface of the frame metal fitting.

In accordance with the seventh aspect, even in the case that the adapter is erroneously attached to a connector, it is possible to completely prevent a short-circuit from occurring between contact shoes of the connector on the basis of the insulative coating film formed in the entire of the outer surface of the frame metal fitting.

In accordance with an eighth aspect of the present invention, there is provided an adapter for a memory card, wherein an insulative coating film is partly formed in a periphery of the outer surface of the frame metal fitting.

In accordance with the eighth aspect, even in the case that the adapter is erroneously attached to a connector, it is possible to sufficiently prevent a short-circuit from occurring between contact shoes of the connector on the basis of the insulative coating film formed only in the necessary portion in the periphery of the outer surface of the frame metal fitting.

In accordance with a ninth aspect of the present invention, there is provided an adapter for a memory card, wherein the insulative coating film is formed with a thermoplastic resin or a thermosetting resin such as an acrylic resin, a polyethylene resin, a polyimide resin, a polyamide resin, a fluorine contained resin, an epoxy resin, a polyester resin and the like.

In accordance with the ninth aspect, since various thermoplastic or thermosetting resins are used as the insulative coating film, a mechanical strength with respect to the frame metal fitting is not weakened, and it is possible to maintain an insulating property for a long time.

In accordance with a tenth aspect of the present invention, there is provided an adapter for a memory card as recited in any one of the first, seventh and eighth aspects, wherein the memory card is an RS-MMC.

In accordance with the tenth aspect, it is possible to use the compact RS-MMC in the same manner as that of the normal size MMC.

BRIEF DESCRIPTION OF THE DRAWINGS

FIGS. 8A and 8B are a plan view and a side elevational view before the adapter is assembled;

FIGS. 19A to 19E are cross sectional views showing a process of attaching the memory card to the adapter;

FIG. 20 is a cross sectional view showing operation of detaching the memory card from the adapter;

FIG. 21 is a cross sectional view showing an undesirable state in the case that a displacement control portion is not provided;

DESCRIPTION OF THE PREFERRED EMBODIMENTS

A description will be given below of an embodiment in accordance with the present invention with reference to FIGS. 1 to 27. An adapter 1 in accordance with the embodiment is provided with a frame metal fitting 2 and a core 3.

Figure 16:
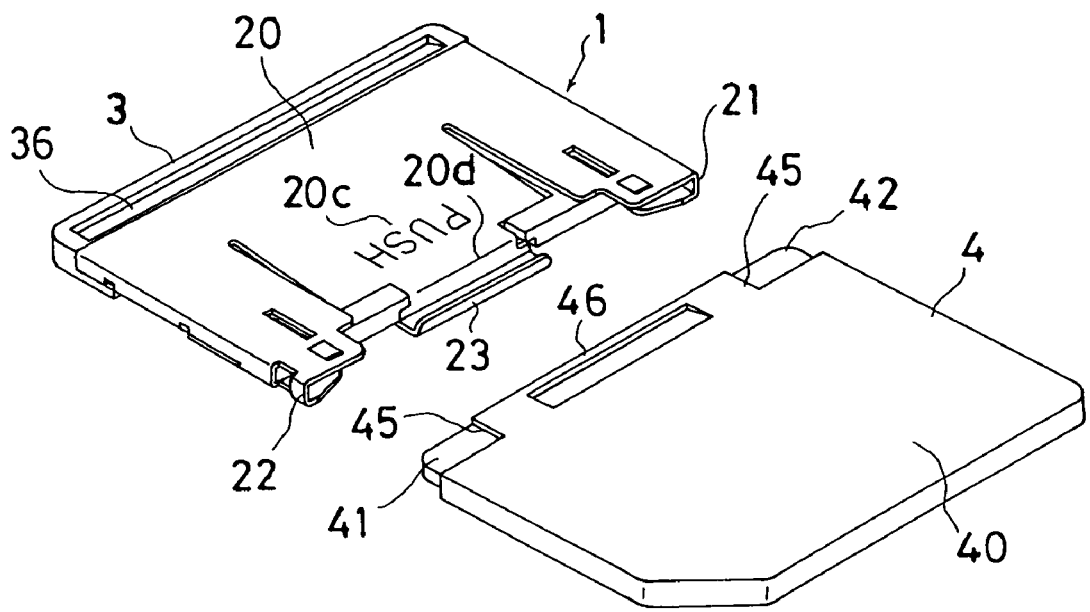
FIG. 16 is an exploded perspective view before a memory card is attached to the adapter.
Figure 17:
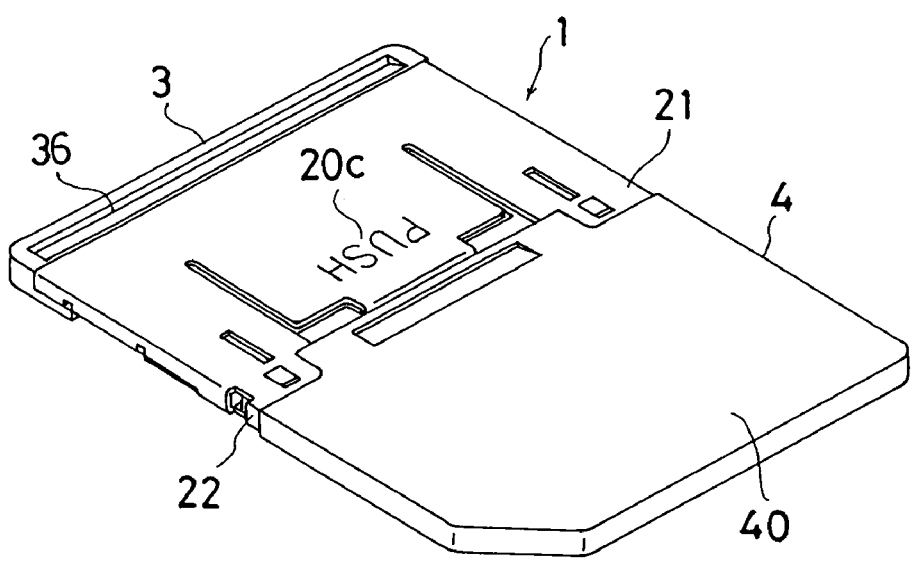
FIG. 17 is a perspective view showing a state that the memory card is attached to the adapter, as seen from a lower side.
Figure 18:
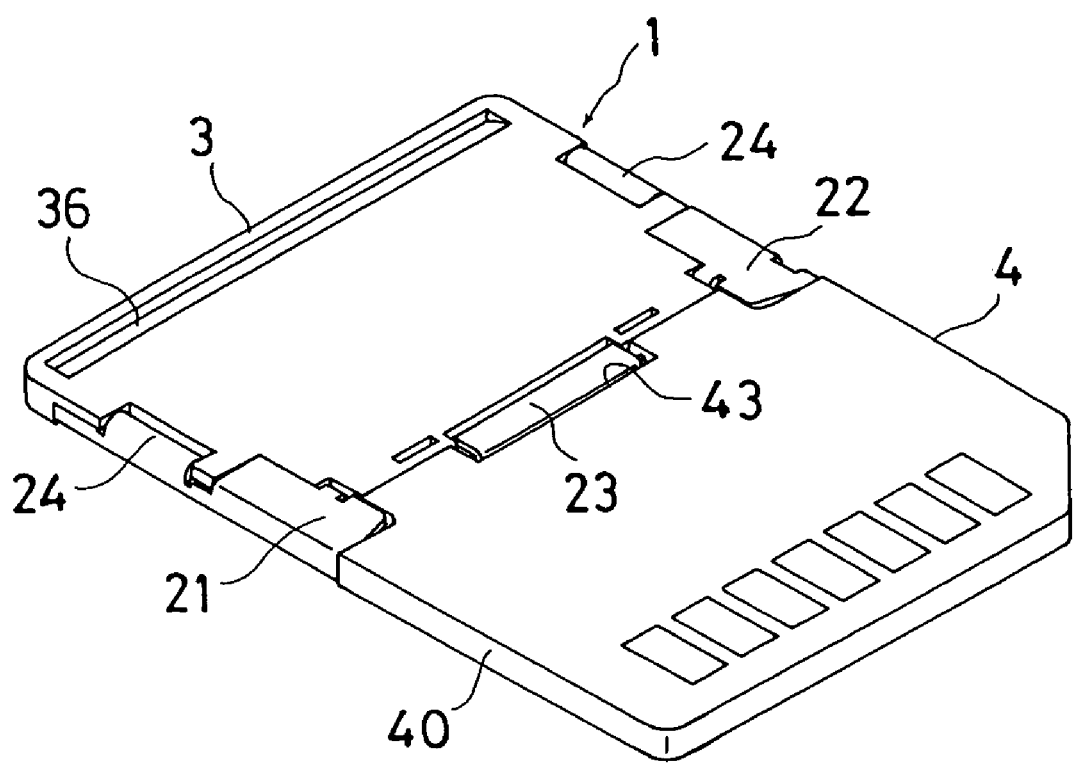
FIG. 18 is a perspective view showing a state that the memory card is attached to the adapter, as seen from an upper side.

Before describing the adapter 1 in accordance with the embodiment, a description will be given of a memory card 4 attached to the adapter 1. The memory card 4 is a compact memory card which is shorter than a normal size memory card, and in this embodiment, an RS-MMC (registered trade mark) is used. In the compact memory card 4 of the RS-MMC, a pair of thinned held portions 41 and 42 are formed on both surfaces in both end portions in the width direction, of a main body 40 as shown in FIGS. 16 to 18. The held portions 41 and 42 are held by holding portions 21 and 22 of the adapter 1. Further, a rectangular engagement groove 43, which is stepped to be made lower, is formed between a pair of the held portions 41 and 42. The engagement groove 43 is formed in a lower surface of the main body 40, and a hook portion 23 of the adapter 1 is engaged with the engagement groove 43. The held portions 41 and 42 and the engagement groove 43 are formed in end portions of the main body 40 in the side of the adapter 1.

Further, the memory card 4 can be identified on the basis of a color by coating with a coloring material in various colors on the surface of the memory card 4, whereby it is possible to improve a convenience. Further, the frame metal fitting 2 is hardened in accordance with a heat treatment at a temperature between about 200 and 300° C. applied in the process of the coating work, whereby it is possible to improve a mechanical strength. In accordance with an actual measurement, about 5% increase is recognized.

Figure 26:
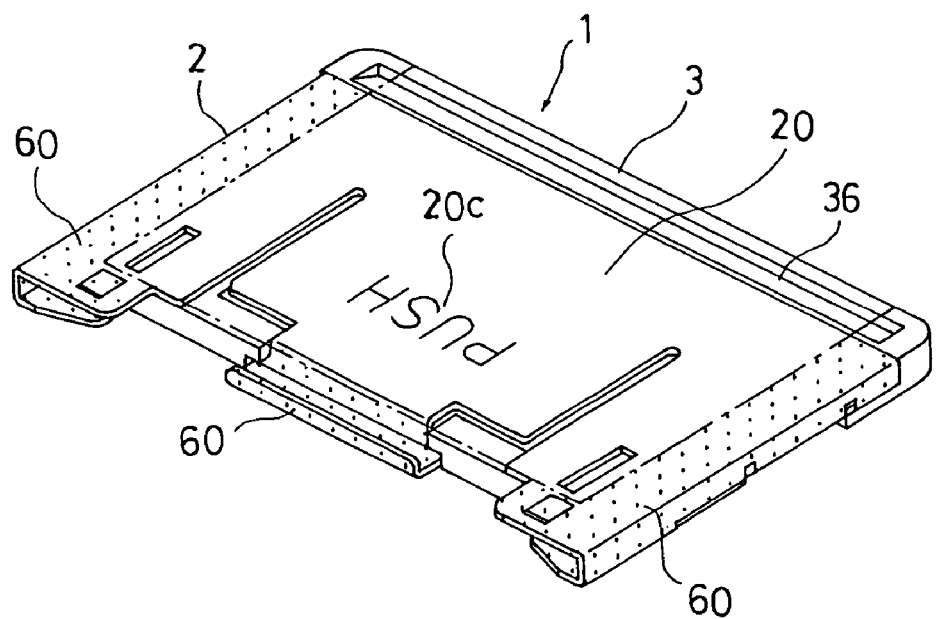
FIG. 26 is a perspective view showing an adapter in accordance with the other example from an upper side.
Figure 27:
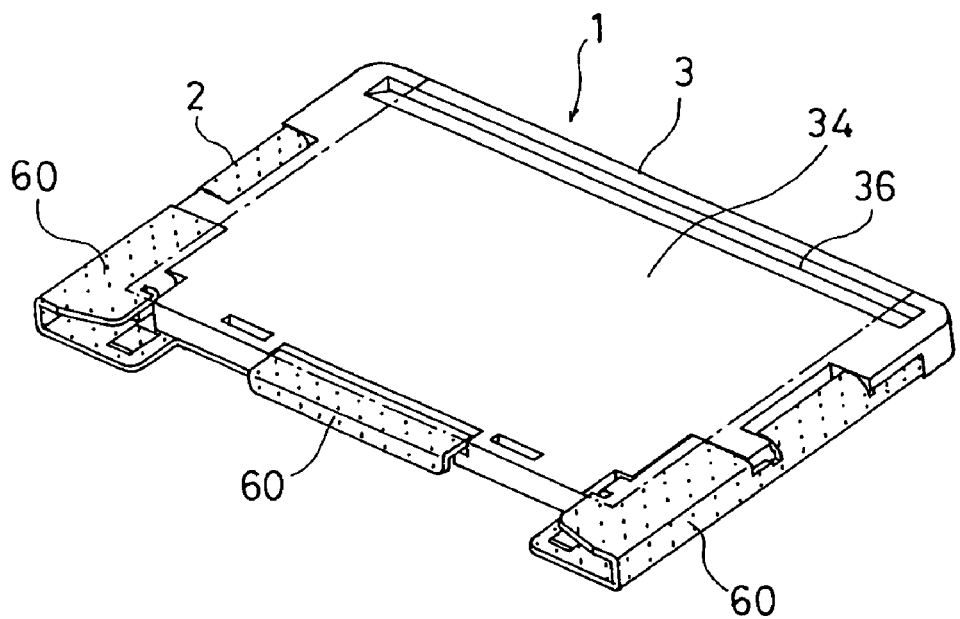
FIG. 27 is a perspective view showing the adapter in accordance with the other example from a lower side.
Figure 30:
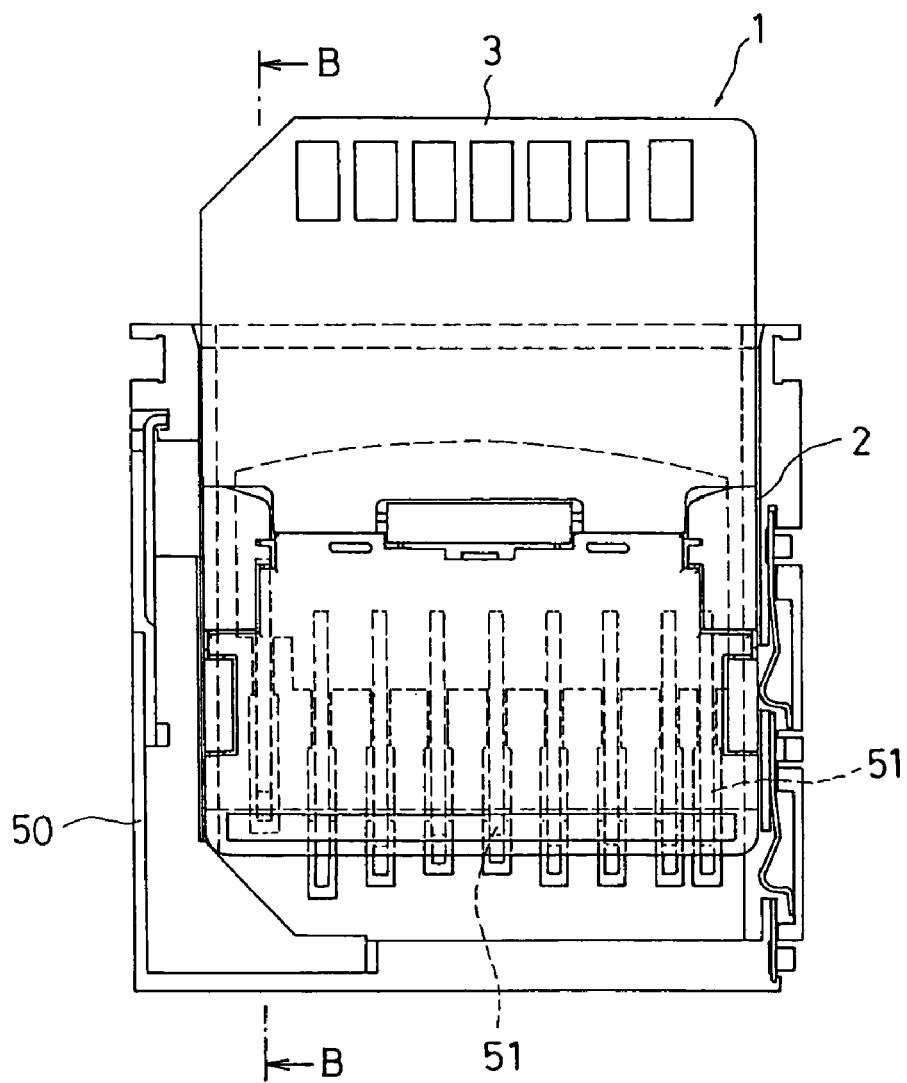
FIG. 30 is a plan view showing a state that the adapter and the memory card are erroneously inserted to the connector.
Figure 31:
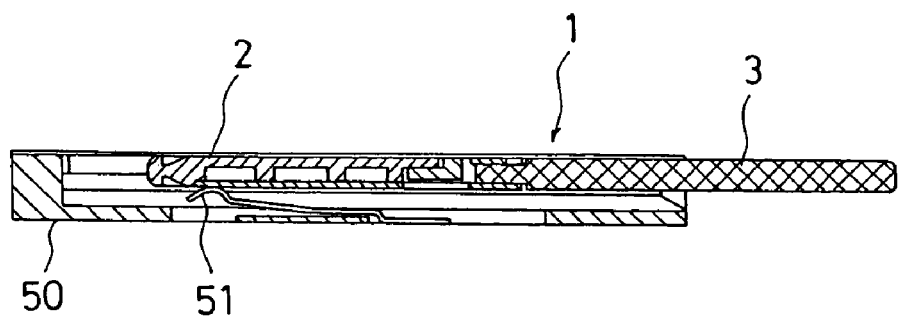
FIG. 31 is a cross sectional view along a line B—B as seen in an arrowed direction in FIG. 30.

The frame metal fitting 2 in the adapter 1 is structured such that the memory card 4 is attached thereto, and the entire thereof is formed of a metal such as a stainless or the like. Further, an insulative coating film 60 is formed on the outer surface of the frame metal fitting 2 formed entirely of the metal, in order to prevent contact shoes 51 of a connector 50 from being short-circuited even in the case that the adapter 1 is erroneously attached to the adapter 1, as shown in FIGS. 30 and 31. The insulative coating film 60 is made of a raw material comprising a thermoplastic or thermosetting resin such as an acrylic resin, a polyethylene resin, a polyimide resin, a polyamide resin, a fluorine contained resin, an epoxy resin, a polyester resin and the like. Further, for forming the insulative coating film 60 on the frame metal fitting 2, any means such as painting, coating and the like maybe employed. Further, it is preferable that a range in which the insulative coating film 60 is formed is the entire of the outer surface of the frame metal fitting 2, however, is not limited to this. For example, as shown in FIGS. 26 and 27, the range may be only an outer periphery (about 2 to 4 mm) of the frame metal fitting 2. A function of preventing the short-circuit can be sufficiently achieved by this range.

Figure 1:
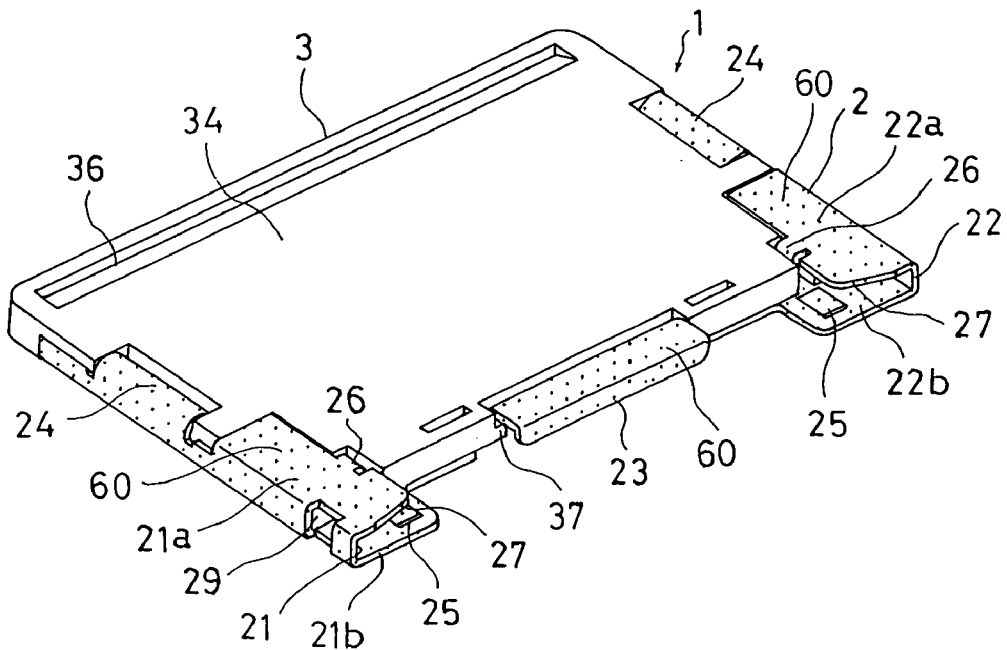
FIG. 1 is a perspective view showing an adapter in accordance with the present invention from an upper side.
Figure 2:
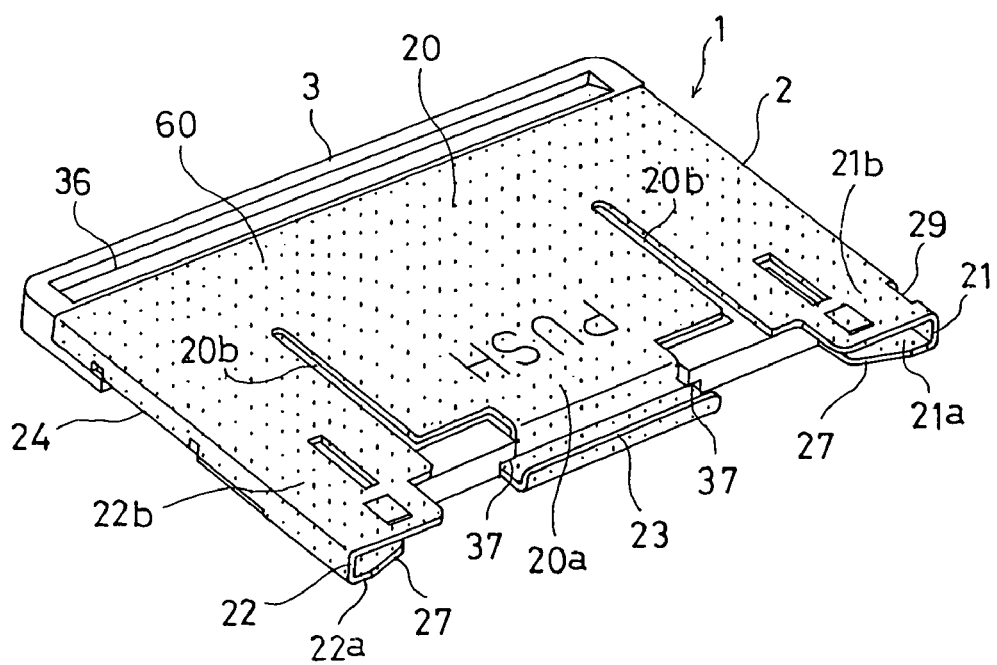
FIG. 2 is a perspective view showing the adapter from a lower side.

Further, the frame metal fitting 2 has an approximately flat supporting plate portion 20, a pair of right and left holding portions 21 and 22 formed with respect to the supporting plate portion 20, a hook portion 23 and a caulking projection 24, as shown in FIGS. 1, 2 and 8.

The holding portions 21 and 22 are formed as a pair by bending both right and left end portions of the supporting plate portion 20 in the side to which the memory card 4 is attached in an approximately C shape. The respective holding portions 21 and 22 are formed in the approximately C shape such that opening portions thereof are faced to each other. Both end portions of the memory card 4 are inserted to the holding portions 21 and 22, whereby the holding portions 21 and 22 hold the held portions 41 and 42 in both end portions of the memory card 4. Since the memory card 4 is prevented from being displaced in the lateral and vertical directions on the basis of the holding, the adapter 1 and the memory card 4 are assembled in a flush state with no play, as shown in FIGS. 17 and 18. Further, the holding portions 21 and 22 hold both end portions of the memory card 4, whereby it is possible to prevent the adapter 1 and the memory card 4 from bending in a V shape, and it is possible to prevent both the elements from coming off due to distortion because these elements are not distorted.

The holding portions 21 and 22 are bent in the approximately C shape, whereby spring force is applied to upper pieces 21a and 22a, and the upper pieces 21a and 22a are elastically brought into contact with the memory card 4. Since the holding portions 21 and 22 elastically hold the memory card 4 inserted in the manner mentioned above, it is possible to securely hold the memory card 4.

On the other hand, a centering boss portion 25 is formed in lower pieces 21b and 22b of the holding portions 21 and 22 in the side of the supporting plate portion 20. The centering boss portion 25 is formed by partly protruding the lower pieces 21b and 22b. The respective centering boss portions 25 are brought into contact with step portions 45 corresponding to boundary portions between the held portions 41 and 42, and the main body portion 40 in the memory card 4, by inserting the memory card 4 to the holding portions 21 and 22. Since the memory card 4 is centered on the basis of this contact, it is possible to securely attach the memory card 4 to a regular position with respect to the adapter 1. In this case, the centering boss portion 25 may be formed in any one of a pair of the holding portions 21 and 22.

Figure 5:
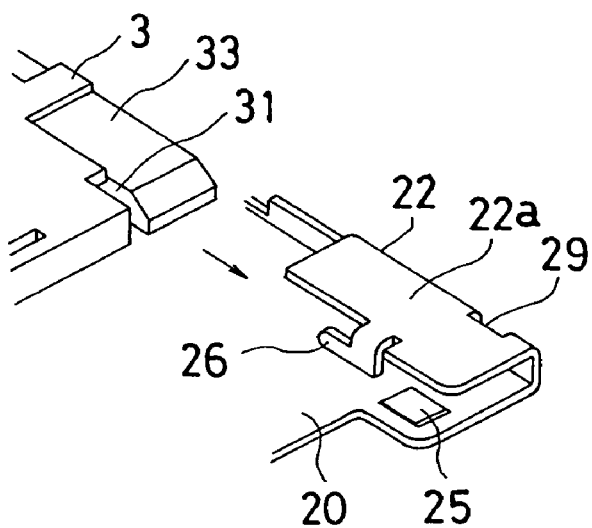
FIG. 5 is an exploded perspective view explaining an opening prevention piece.
Figure 6:
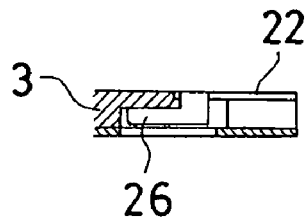
FIG. 6 is a cross sectional view showing operation of the opening prevention piece.
Figure 7:
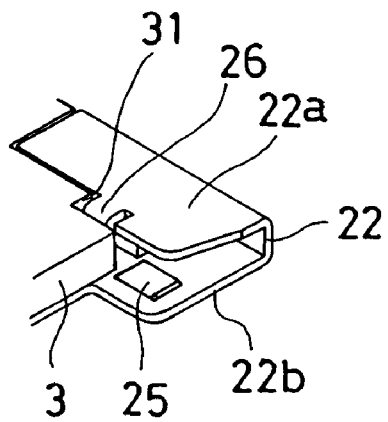
FIG. 7 is a perspective view showing a state that the opening prevention piece is assembled.

An opening prevention piece 26 is formed in the upper pieces 21a and 22a of the holding portions 21 and 22. The opening prevention piece 26 is formed by bending each of the upper pieces 21a and 22a downward and extending toward the core 3 under the bent state, as shown in FIGS. 5 to 7. The opening prevention piece 26 enters into a slit 31 formed in the core 3 so as to be engaged with the core 3. In accordance with the engagement, the opening prevention piece 26 prevents the upper pieces 21a and 22a from being deformed upward and being bent upward. Accordingly, it is possible to prevent the holding portions 21 and 22 from opening from the approximately C shape in a molded initial state. Therefore, since the frame metal fitting 2 maintains a fixed thickness, and the entire thickness of the adapter 1 is not increased, it is possible to securely attach to the electronic equipment, and it is possible to securely hold the memory card 4 by means of the holding portions 21 and 22, whereby it is possible to prevent the memory card 4 from coming off. Further, even in the case that the memory card 4 is frequently attached and detached, the holding portions 21 and 22 work to maintain the approximately C shape, so that a durability can be achieved.

An inclined surface 27 is formed in each of the upper pieces 21a and 22a of a pair of the holding portions 21 and 22 (refer to FIG. 1). The inclined surface 27 is formed on an end surface on the side of inserting the memory card 4 of each of the upper pieces 21a and 22a in the holding portions 21 and 22, and is formed by cutting diagonally toward the far side in the direction of inserting the memory card 4. Since the inclined surface 27 is formed in this manner, no resistance is generated in the case that the memory card 4 is regularly inserted, and a great resistance is generated in the case that the memory card 4 is reversely inserted. Accordingly, it is possible to prevent the memory card 4 from being reversely attached on the basis of a feeling at a time of inserting. In this case, lengths of the upper pieces 21a and 22a and the lower pieces 21b and 22b in a pair of the holding portions 21 and 22 may be slightly different as in the illustrated embodiment or they may be formed approximately at the same length as the shorter side.

The hook portion 23 is provided in the frame metal fitting 2 so as to be positioned between a pair of the holding portions 21 and 22. The hook portion 23 is formed by bending the end portion of the supporting plate portion 20 downward approximately orthogonally, is formed in the side to which the memory card 4 is attached similarly to the holding portions 21 and 22, and is formed, however, in the frame metal fitting 2 so as to be arranged at a slightly inwardly retreated position than the holding portions 21 and 22. The hook portion 23 is engaged with the engagement groove 43 of the memory card 4, and the memory card 4 is held so as to be prevented from coming off from the adapter 1 on the basis of the engagement. In this case, it is possible to engaged with an engagement groove 43, provided in an opposite side to the engagement groove 43 by adjusting the height of the hook portion 23. Accordingly, it is possible to attach to the memory card 4 from both the front and back sides (refer to FIGS. 19 to 21).

The hook portion 23 is formed so as to be provided continuously with the supporting plate portion 20, and long linear slits 20b and 20b are parallelly formed in a continuously provided portion 20a with the hook portion 23 in the supporting plate portion 20, as shown in FIGS. 2 and 8. Spring force is applied to the continuously provided portion 20a by forming of the slits 20b and 20b, and accordingly, the spring force is applied to the hook portion 23 provided continuously with the continuously provided portion 20a. Therefore, since the hook portion 23 is engaged with the memory card 4 with the spring force being applied, it is possible to securely engage. Further, as shown in FIG. 2, characters "PUSH" 20c and a serration 20d are formed near the continuously provided portion 20a by engraving or printing. Accordingly, an operability is improved, since a portion to be pushed is indicated, and a slip resisting function is provided.

The caulking projection 24 is formed projectingly in both sides of the supporting plate portion 20 in the width direction, and fixes the core 3 by being caulked.

The core 3 is constituted by a resin molded body made of such as a PBT resin or the like, and is formed in an approximately rectangular thin plate in a plan view. Since the core 3 is formed of the resin molded body, it is possible to achieve a weight saving and a handling property is improved. Further, the core 3 may be made by painting or coating a coloring material on a molded product obtained by a metal die casting (for example, a aluminum, a zinc or the like). In the case of molding with the metal, the core may be heavy, however, a strength can be widely increased.

Figure 4:
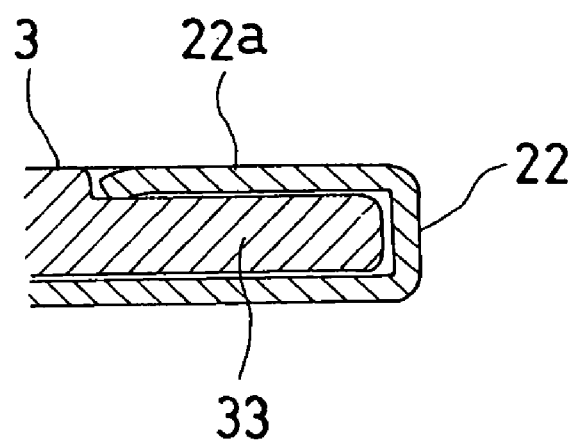
FIG. 4 is a cross sectional view showing a holding state by a holding portion.

Insertion portions 33 inserted to the holding portions 21 and 22 of the frame metal fitting 2 are formed in opposite surfaces to the frame metal fitting 2 in the core 3 by applying recesses on the upper surface. The core 3 is mounted to the frame metal fitting 2 in a state of being positioned in the lateral direction, by inserting the insertion portions 33 to the holding portions 21 and 22. In this case, as mentioned above, since the spring force is applied to the holding portions 21 and 22, the upper pieces 21a and 22a of the holding portions 21 and 22 are elastically pressure contacted with the insertion portions 33 as shown in FIG. 4, by inserting the insertion portions 33 to the holding portions 21 and 22. Accordingly, it is possible to temporarily assemble the core 3 with respect to the frame metal fitting 2.

The core 3 is mounted to the frame metal fitting 2 by sliding on the upper surface of the supporting plate portion 20, and the upper surface 34 of the core 3 is exposed in a state of being mounted to the frame metal fitting 2. Since the memory card 4 can be attached by manually gripping the exposed upper surface 34, it is possible to prevent the hands from being injured by the frame metal fitting made of metal. In this case, it is possible to apply creping work on the upper surface 34 of the core 3, whereby an irregularity caused by a molding sink of the resin at a time of molding is inconspicuous so as to improve an outer appearance, and it is possible to prevent the slip at a time of assembling in the frame metal fitting 2.

The slit 31 mentioned above is formed in the insertion portion 33 which is the end portion on the side where the memory card 4 is attached, in the core 3. Further, a caulking receiving portion 32 corresponding to the caulking projection 24 is formed in both sides in the width direction at a predetermined length. The caulking receiving portion 32 is formed such that the outer periphery is formed in an arch shape, as shown in FIG. 15, and is connected to the caulking projection 24 on the basis of the caulking of the caulking projection 24 in the frame metal fitting 2. It is possible to fix the core 3 to the frame metal fitting 2 on the basis of such the connection. In the fixing obtained by the caulking operation as mentioned above, it is possible to obtain great fixing strength as is different from the fixing achieved by the pressure insertion, and it is possible to stably fix to the core 3 and the frame metal fitting 2 without aged deterioration. However, in addition to the caulking method, a fixing method by using an adhesive agent may be employed.

Figure 12:
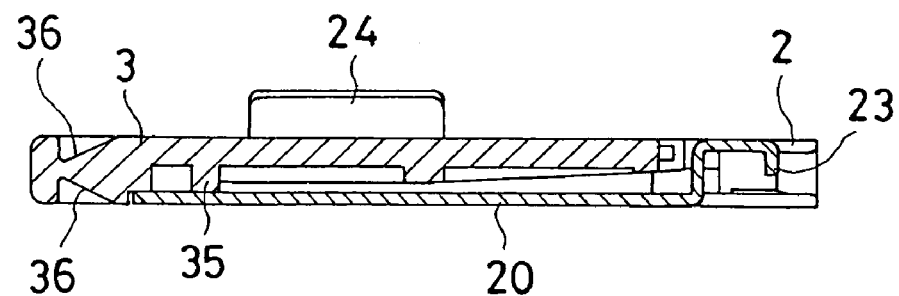
FIG. 12 is an enlarged cross sectional view along a line X—X in FIG. 11.
Figure 13A:
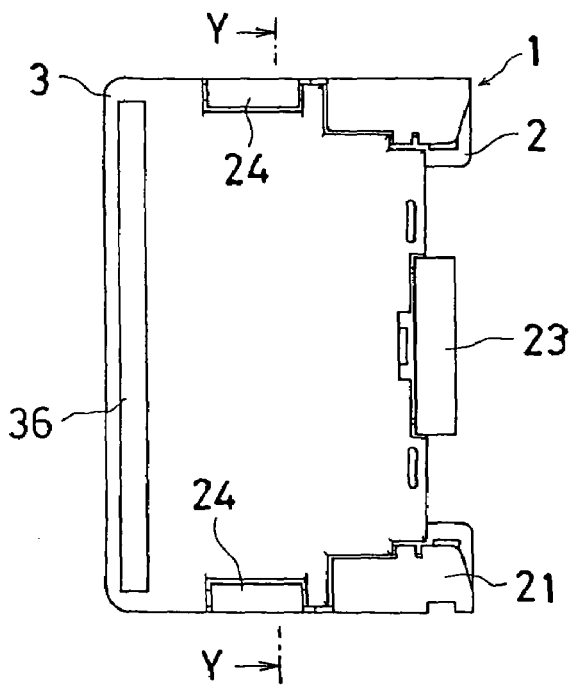
FIGS. 13A and 13B are a plan view and a side view showing a state that the adapter is assembled.
Figure 13B:
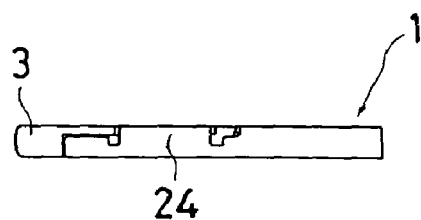
Figure 14:
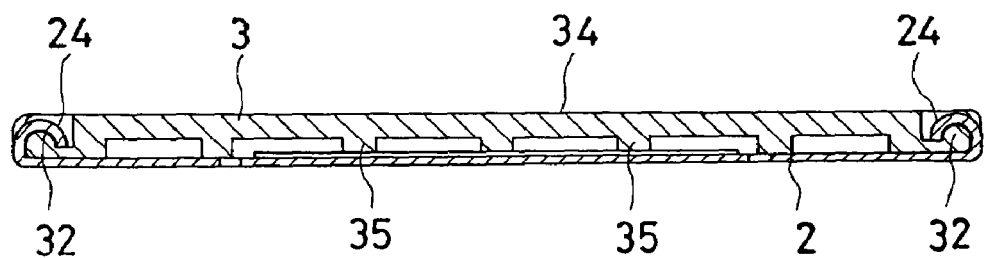
FIG. 14 is an enlarged cross sectional view along a line Y—Y in FIG. 13.

Further, ribs 35 are formed in the vertical and horizontal directions on a lower surface of the core 3, as shown in FIGS. 12 and 14. Strength is maintained by applying a so-called lightening work in the core 3 in the manner mentioned above, and it is possible to reduce a used resin amount. Further, a long groove 36 is formed in a rear portion of the core 3 so as to make it easy to take out from the electronic apparatus. The long groove 36 is provided in both upper and lower surfaces in the illustrated embodiment, however, may be provided in any one surface. In this case, the long groove 36 is not essential because the operation can be performed without the long groove 36.

Figure 3:
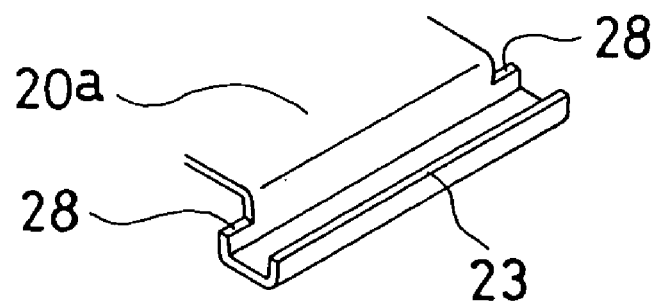
FIG. 3 is a perspective view showing a hook portion of a frame metal fitting.

A displacement control portion is formed in the core 3 and the hook portion 23 of the frame metal fitting 2. The displacement control portion is constituted, as shown in FIGS. 2 and 3, by contact lug portions 28 formed in both end portions of the hook potion 23 in the longitudinal direction, and pressing portions 37 formed in the core 3 so as to correspond to the contact lug portions 28. In the displacement control portion mentioned above, at a time of assembling the core 3 to the frame metal fitting 2, a pressing portions 37 are brought into contact with the contact lug portions 28 from a lower side so as to hold. Since it is possible to control such a displacement (refer to FIG. 21) that the hook portion 23 and the continuously provided portion 20a are apart from the core 3, on the basis of such the holding, these elements do not move apart from the core 3. Accordingly, since the attitude of the hook portion 23 with respect to the memory card 4 is always constant, the hook portion 23 can securely engage with the memory card 4.

FIGS. 8 to 15 show a process for manufacturing the adapter 1 by assembling the core 3 in the frame metal fitting 2.

Figure 9A:
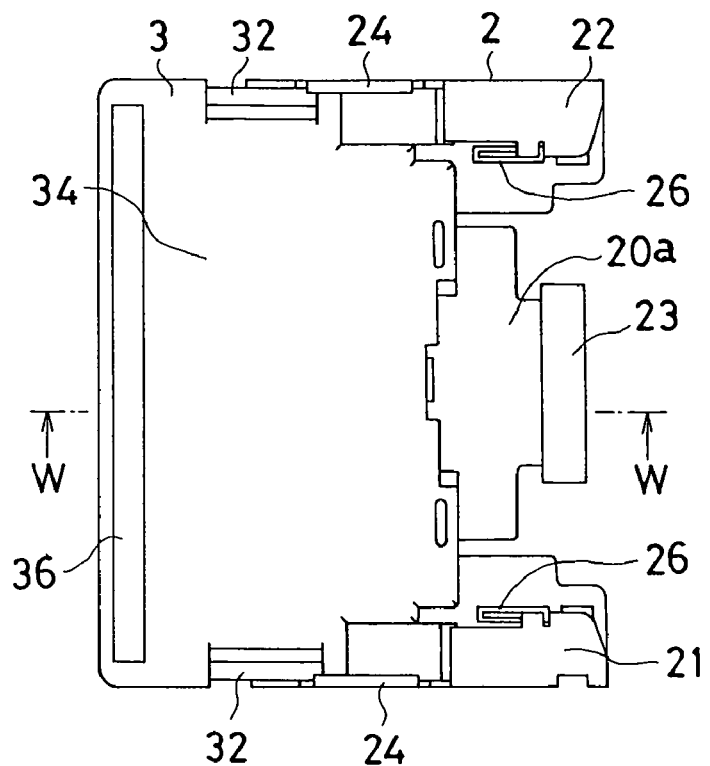
FIGS. 9A and 9B are a plan view and a side view in the middle of assembling the adapter.
Figure 9B:
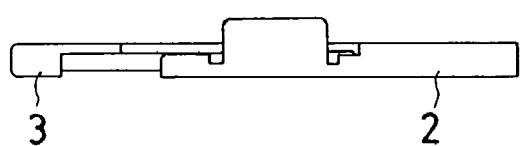
Figure 10:
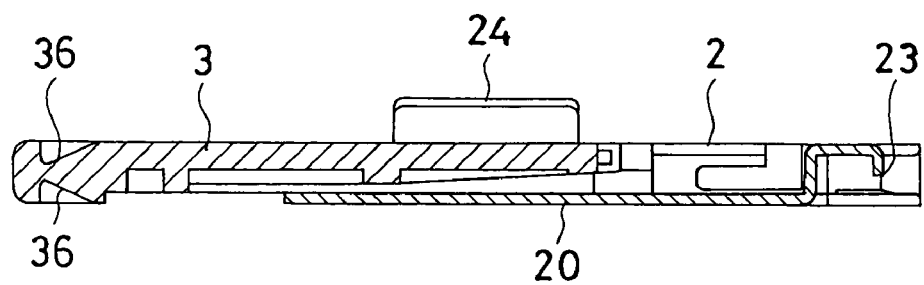
FIG. 10 is an enlarged cross sectional view along a line W—W in FIG. 9.

As shown in FIG. 8, the core 3 is approached from the rear side of the frame metal fitting 2, and as shown in FIGS. 9 and 10, the insertion portions 33 of the core 3 are inserted into the holding portions 21 and 22 of the frame metal fitting 2 from the rear side. At this time, the caulking projection 24 is in a state that the caulking projection 24 projects from the supporting plate portion 20.

Figure 11A:
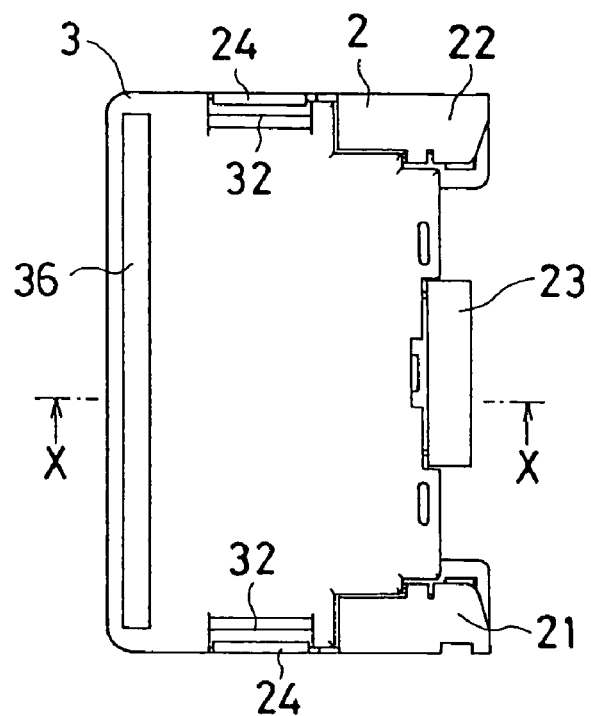
FIGS. 11A and 11B are a plan view and a side view showing a temporary assembled state of the adapter.
Figure 11B:
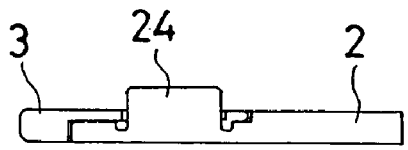

FIG. 11 shows a state that the insertion portions 33 are completely inserted into the holding portions 21 and 22. At this time, since the holding portions 21 and 22 have the spring force, the holding portions 21 and 22 can firmly hold the insertion portions 33, whereby the core 3 and the frame metal fitting 2 are in a temporarily assembled state.

Figure 15A:
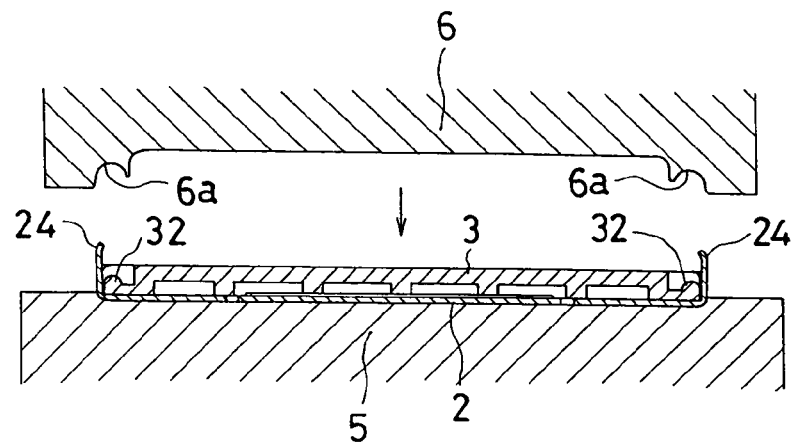
FIGS. 15A to 15C are cross sectional views showing a state of caulking process.
Figure 15B:
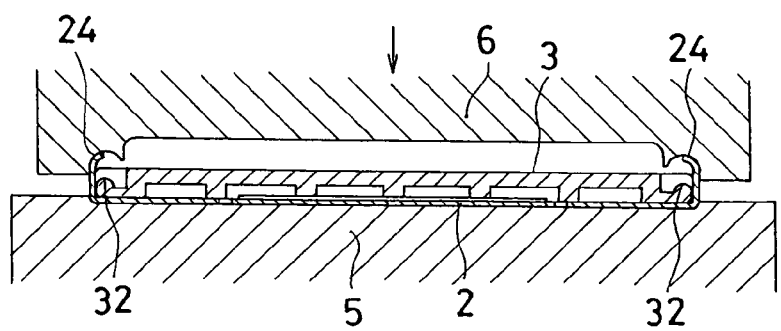
Figure 15C:
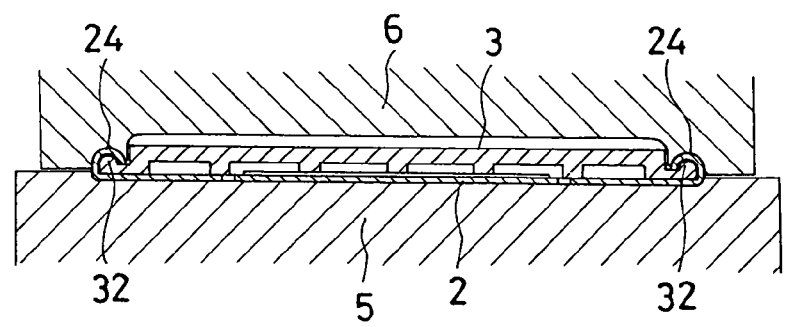

FIG. 15 shows a state that the caulking operation is applied to the temporarily assembled state. An assembly in the temporarily assembled state is positioned and mounted on a caulking die 5, and a caulking punch 6 is approached to the caulking die 5 (a state in FIG. 15A). An arcuate caulking recess portion 6a is formed in the caulking punch 6, and the caulking recess portion 6a is brought into contact with the caulking projection 24 on the basis of the approaching to the caulking die 5 so as to forcibly bend the projection 24 (states in FIGS. 15B and 15C). Accordingly, the caulking projection 24 is caulked on the caulking receiving portion 32 of the core 3, and the core 3 and the frame metal fitting 2 are firmly assembled, whereby the adapter 1 is manufactured as shown in FIGS. 13, 14, 1 and 2. The manufactured adapter 1 is structured such that an entire thickness is approximately the same thickness as that of the memory card 4.

FIGS. 16 to 19 show processes for attaching the memory card 4 to the adapter 1 manufactured in the manner mentioned above.

As shown in FIGS. 16 and 19A, the adapter 1 and the memory card 4 are opposed and moved close to each other, and the holding portions 41 and 42 of the memory card 4 are inserted into the holding portions 21 and 22 of the frame metal fitting 2 gradually. In accordance with this insertion, a rear end portion 46 of the memory card 4 is brought into contact with the hook portion 23 of the frame metal fitting 2 (FIG. 19B) and pushes down the hook portion 23. At this time, since the hook portion 23 slides along a guide taper 46a by the guide taper 46a being formed in the rear end portion 46 of the memory card 4 in the attaching side, it is possible to smoothly push down (FIGS. 19C and 19D). When the hook portion 23 gets over the rear end portion 46 of the memory card 4 on the basis of the sliding motion, the hook portion 23 enters into the engagement groove 43 of the memory card 4 on the basis of the spring force, and engages with the engagement groove 43 on the basis of the spring force (FIG. 19E). In accordance with this engagement, the memory card 4 is attached to the adapter 1. Since the attachment mentioned above can be achieved only by moving the adapter 1 and the memory card 4 close to each other, it is possible to easily attach.

In the attached state of the memory card 4, a total size of the memory card 4 and the adapter 1 is the same size as that of a normal size memory card. Further, as mentioned above, the thickness of the adapter 1 is approximately the same as the thickness of the memory card 4. Accordingly, in a state that the memory card 4 is attached to the adapter 1, the total size is the same as the size of normal size memory card. Therefore, since it is possible to use in the electronic equipment, the cellular phone and the like for the normal size memory card, it is possible to expand a usable range of the compact memory card such as the RS-MMC or the like.

In this case, since the hook portion 23 is prevented from being displaced in the direction of moving apart from the core 3, by the displacement control portion constituted by the contact lug portion 28 and the pressing portion 37 of the core 3, the hook portion 23 does not move apart from the core 3. Accordingly, a state shown in FIG. 21 does not occur, the attitude of the hook portion 23 with respect to the memory card 4 is always constant, and it is possible to securely engage with the memory card 4.

FIG. 20 shows an operation of taking out the memory card 4 from the adapter 1. At a time of taking out, the hook portion is pressed down and the engagement with the engagement groove 43 is cancelled. Then, the memory card 4 can be taken out by drawing away the memory card 4 from the adapter 1, in so cancelled state. Accordingly, it is possible to easily take out the memory card 4.

In this embodiment, as shown in FIGS. 1 and 2, the notch portion 29 is formed in the holding portion 21 or 22. The notch portion 29 is formed in a rectangular shape in the side surface portion of one holding portion 21, however, it may be formed in an arcuate shape. The notch portion 29 formed in this manner can be set as a target of a directionality at a time of attaching the memory card 4.

Figure 22:
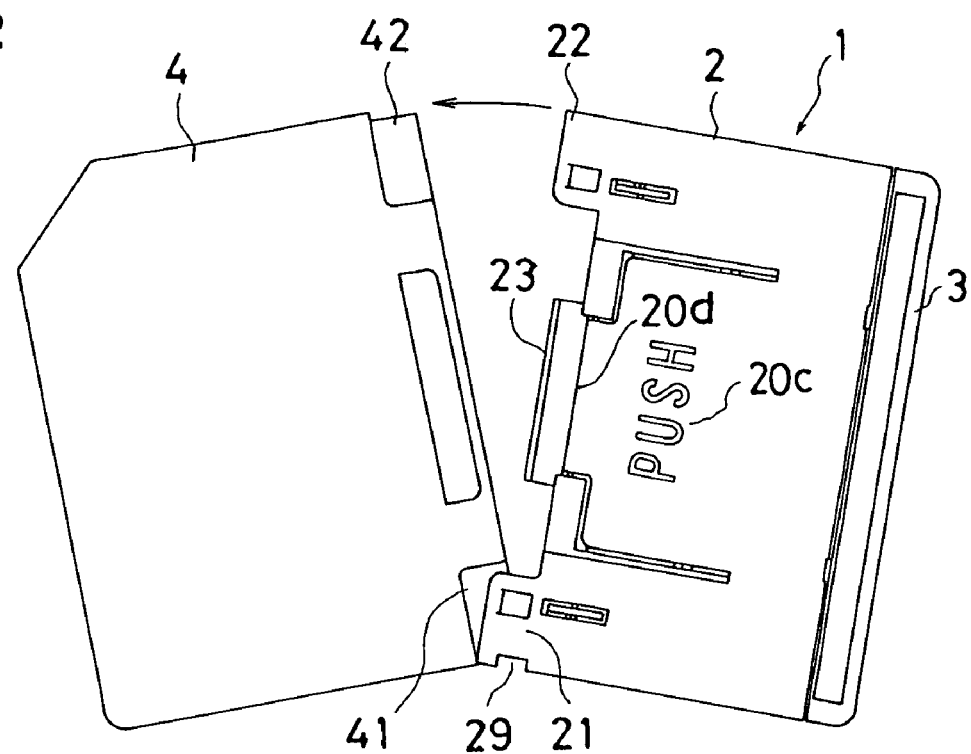
FIG. 22 is a bottom view showing another method of attaching the memory card to the adapter.

FIG. 22 shows an operation of attaching the memory card 4 by setting the notch portion 29 as the target. The memory card 4 is attached by relatively rotating the adapter 1 around the notch portion 29 in a state of hooking the end portion where the notch portion 29 is formed in the adapter 1 on the end portion of the memory card 4. In the attachment on the basis of the rotation, since the directionality at a time of attaching is clear, there is an advantage that it is possible to prevent an erroneous attachment and a reverse attachment.

Figure 23:
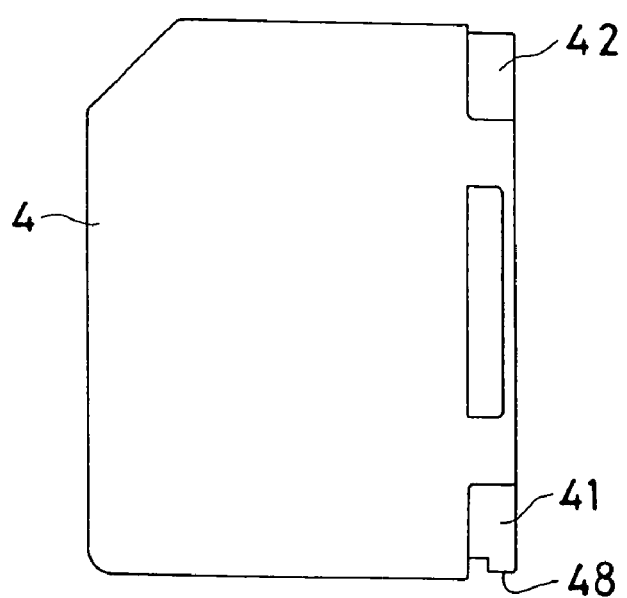
FIG. 23 is a bottom view showing a memory card in accordance with another aspect.
Figure 24:
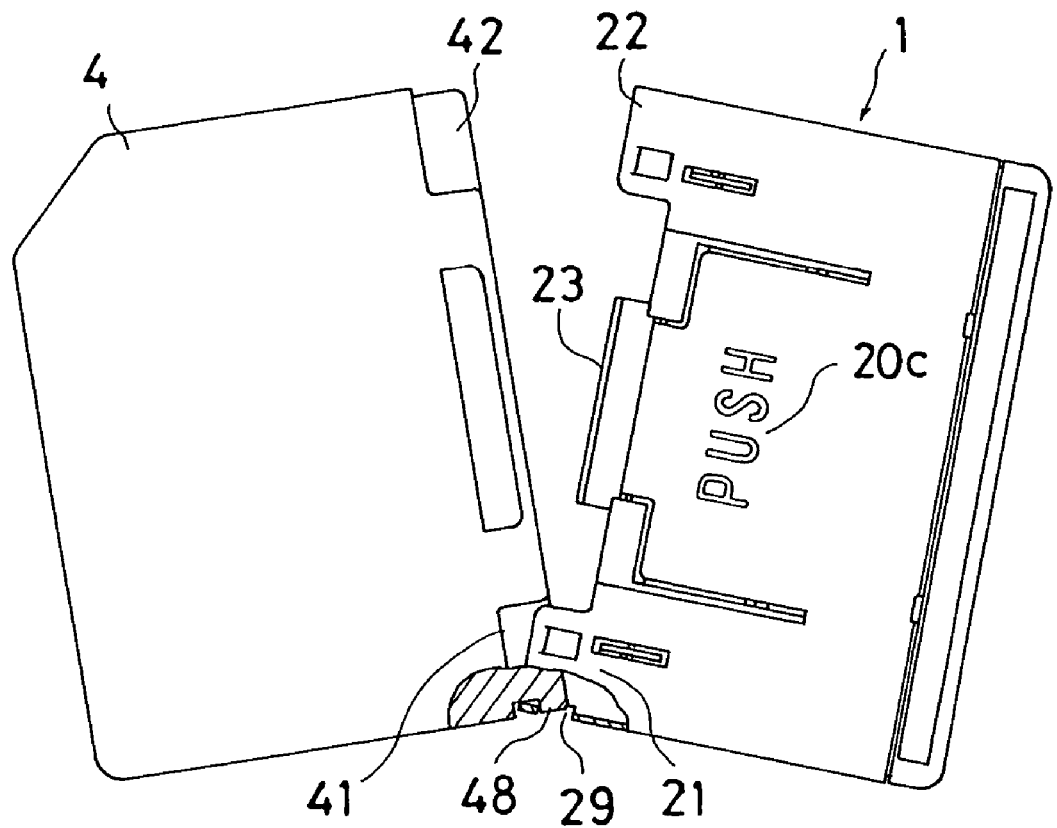
FIG. 24 is a bottom view showing operation of attaching the memory card in FIG. 23 to the adapter.
Figure 25:
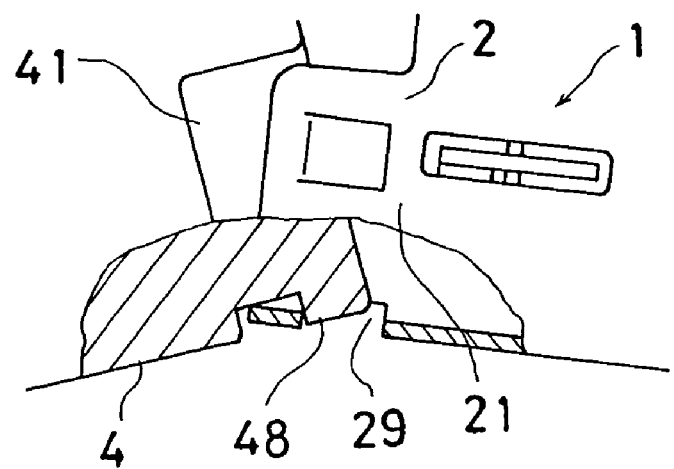
FIG. 25 is a partly enlarged bottom view of FIG. 24.

FIG. 23 shows another aspect of the memory card 4, in which a locking projection 48 is formed in an end portion in an attached side. FIGS. 24 and 25 show an operation of attaching the memory card 4 in accordance with the aspect in FIG. 23 to the adapter 1. The attachment is achieved by inserting the locking projection 48 to the notch portion 29 formed in the adapter 1 so as to hook, and relatively rotating the adapter 1 and the memory card 4 around the notch portion 29 in so hooked state.

In the attachment mentioned above, since the memory card 4 and the adapter 1 are not detached at a time of rotating, it is possible to stably rotate, so that it is possible to further easily and securely attach the memory card 4. Further, since the directionality at a time of attaching is applied by forming the locking projection 48 in one end portion of the memory card 4, it is possible to prevent the memory card 4 from being reversely attached.

Figure 28:
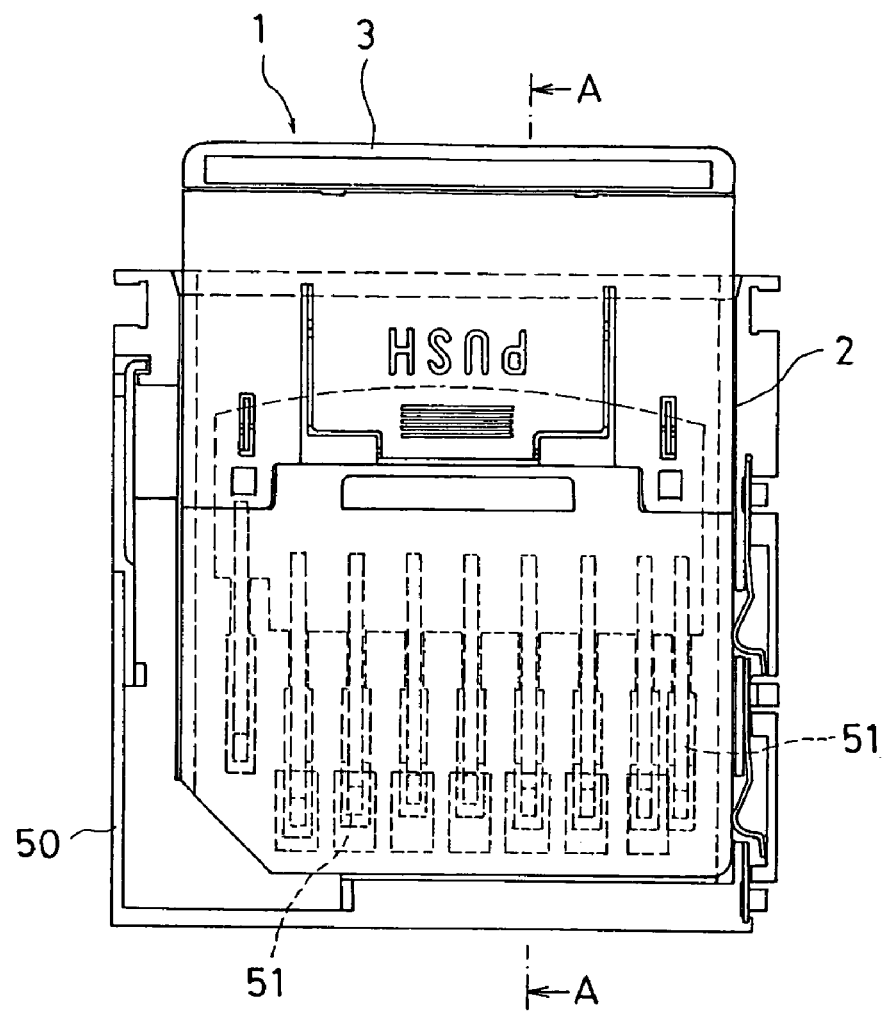
FIG. 28 is a plan view showing a state that the adapter and the memory card are regularly inserted to a connector.
Figure 29:
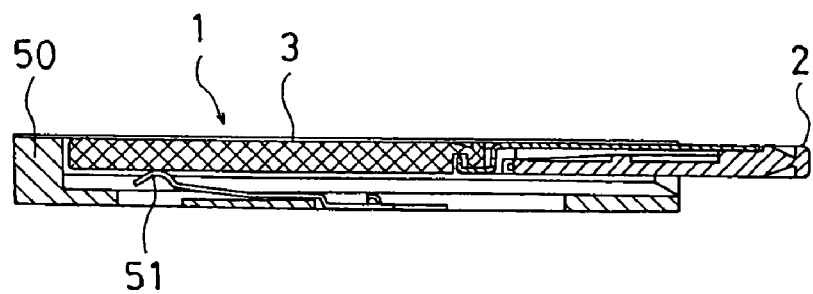
FIG. 29 is a cross sectional view along a line A—A as seen in an arrowed direction in FIG. 28.

FIGS. 28 and 29 show an example that the structure obtained by attaching the memory card 4 to the adapter 1 is correctly inserted and connected to the connector 50. The frame metal fitting 2 in the adapter 1 is not in contact with the contact shoes 51 of the connector 50. Accordingly, a short-circuit does not occur between the contact shoes 51.

FIGS. 30 and 31 show an example that the structure obtained by attaching the memory card 4 to the adapter 1 is erroneously inserted to the connector 50. In other words, memory card 4 is turned over and inserted back to front into the connector 50, the contact shoes 51 of the connector 50 and the frame metal fitting 2 are in contact with each other, and the short-circuit occurs between the contact shoes 51. Even in this case, since the insulative coating film 60 is formed on the outer surface of the frame metal fitting 2, it is possible to prevent the contact shoes 51 from being short-circuited.

Since the present invention is structured in the manner mentioned above in detail, the following effects can be achieved.

In accordance with the invention described in the first aspect, since the size of the entire including the adapter is equal to the size of the normal size memory card, it is possible to use in the electronic equipment, the cellular phone and the like for the normal size memory card. Accordingly, it is possible to expand the usable range of the compact memory card. Further, since the insulative coating film is formed on the outer surface of the frame metal fitting, the short-circuit does not occur between the contact shoes of the connector even in the case that the adapter and the memory card are erroneously attached to the connector. Accordingly, it is possible to prevent the relevant electronic equipment from being broken and damaged.

In accordance with the invention described in the second aspect, since the memory card is held on the basis of the spring force, in addition to the same effect as that of the invention in accordance with the first aspect, it is possible to securely attach the memory card, and since the memory card is centered, it is possible to securely attach the memory card to the regular position.

In accordance with the invention described in the third aspect, since the holding portion is prevented from being opened, the frame metal fitting always maintains the fixed thickness, it is possible to securely attach to the electronic equipment, and it is possible to prevent the memory card from falling away.

In accordance with the invention described in the fourth aspect, it is possible to prevent the reverse attachment of the memory card, in addition to the effects of the inventions described in the first to third aspects.

In accordance with the invention described in the fifth aspect, in addition to the effects of the inventions described in the first to fourth aspects, since the memory card can be attached to the adapter by relatively rotating the memory card, it is possible to easily attach the memory card. Further, since the projection portion corresponding to the notch portion is formed in one end portion of the memory card, whereby the directionality at a time of attaching is applied, it is possible to prevent the memory card from being reversely attached.

In accordance with the invention as described in the sixth aspect, in addition to the effects of the invention described in the first aspect, since it is possible to control so as to prevent the hook portion from moving apart from the core, the attitude of the hook portion with respect to the memory card is always constant, and it is possible to securely engage with the memory card by the hook portion.

In accordance with the invention described in the seventh aspect, since the insulative coating film is formed in the entire of the outer surface of the frame metal fitting, even in the case that the adapter and the memory card are erroneously inserted to the connector, it is possible to completely prevent the short-circuit from occurring between the contact shoes of the connector.

In accordance with the invention described in the eighth aspect, since the insulative coating film is formed partly in the periphery of the outer surface of the frame metal fitting, even in the case that the adapter and the memory card are erroneously attached to the connector, it is possible to sufficiently prevent the short-circuit from occurring between the contact shoes of the connector.

In accordance with the invention described in the ninth aspect, since various thermoplastic or thermosetting resins are used as the insulative coating film with respect to the frame metal fitting, the mechanical strength of the frame metal fitting is not weakened, and it is possible to maintain the insulating property for a long time.

In accordance with the invention described in the tenth aspect, in addition to the effects of the inventions described in the first to six aspects, it is possible to use the compact RS-MMC in the same manner as that of the normal size MMC.

What is claimed is:

1. A memory card adapter (1), connectable at an end thereof to an end of a compact memory card (4), wherein said memory card adapter and the compact memory card are connectable to form an assembly, the assembly lying substantially within a single plane and including a thickness, a width, and a length of a longer memory card greater than that of the compact memory card, the length being along a compact-memory-card insertion direction;

said memory card adapter comprising:
a core (3) comprised of a resin molded body; and
a frame metal fining (2) assembled to said core; said frame metal fitting (2) including
a pair of holding portions (21,22) each having a substantially U-shaped configuration, in cross section across the insertion direction, and provided on opposite ends of said frame metal fitting at a memory-card attaching side thereof, to attach the compact memory card thereto and
a hook portion (23) provided between said pair of holding portions at said memory-card attaching side;
said holding portion being adapted to hold the opposite sides of an end of the compact memory card when the compact memory card is assembled with the memory card adapter;
said hook portion being adapted to detachably engage the end of the compact memory card by means of a first spring force so as to prevent said compact memory card from coming off the memory card adapter;
said frame metal fitting (2) further including caulking projections (24) which secure said frame metal fitting to said core (3) by means of caulking onto said core; whereby the assembly is usable in a device adapted to the longer memory card.

2. The adapter for a memory card according to claim 1, wherein said pair of holding portions (21, 22) are formed into the substantially U-shaped configurations so as to exert a second spring force for elastically holding the compact memory card, and comprising a centering boss portion (25) provided on at least one of said holding portions for centering the compact memory card.

3. The adapter for a memory card according to claim 2, wherein end surfaces of said pair of holding portions are cut diagonally (27) to the insertion direction at an insertion side of said compact memory card.

4. The adapter for a memory card according to claim 3, wherein at least one of said pair of holding portions (21, 22) comprises a notch portion (29), wherein said notch portion is serviceable as a center of a relative rotation between the compact memory card and said frame metal fitting when the adapter engages the compact memory card.

5. The adapter for a memory card according to claim 2, wherein at least one of said pair of holding portions (21, 22) comprises a notch portion (29), wherein said notch portion is serviceable as a center of a relative rotation between the compact memory card and said frame metal fitting when the adapter engages the compact memory card.

6. The adapter for a memory card according to claim 1 or 2, wherein at least one of said pair of holding portions (21, 22) includes a respective opening restriction piece (26) for restricting an excessive opening of said one of said holding portions when said frame metal fitting (2) is engaged with said core (3).

7. The adapter for a memory card according to claim 6, wherein end surfaces of said pair of holding portions are cut diagonally (27) to the insertion direction at an insertion side of said compact memory card.

8. The adapter for a memory card according to claim 7, wherein at least one of said pair of holding portions (21, 22) comprises a notch portion (29), wherein said notch portion is serviceable as a center of a relative rotation between the compact memory card and said frame metal fitting when the adapter engages the compact memory card.

9. The adapter for a memory card according to claim 6, wherein at least one of said pair of holding portions (21, 22) comprises a notch portion (29), wherein said notch portion is serviceable as a center of a relative rotation between the compact memory card and said frame metal fitting when the adapter engages the compact memory card.

10. The adapter for a memory card according to anyone of claims 1, wherein end surfaces of said pair of holding portions (21,22) are cut diagonally (27) to the insertion direction at an insertion side of said compact memory card.

11. The adapter for a memory card according to claim 10, wherein at least one of said pair of holding portions (21, 22) comprises a notch portion (29), wherein said notch portion is serviceable as a center of a relative rotation between the compact memory card and said frame metal fitting when the adapter engages the compact memory card.

12. The adapter for a memory card according to anyone of claims 1, wherein at least one of said pair of holding portions (21,22) comprises a not wherein said notch portion is serviceable as a center of a relative rotation between the compact memory card and said frame metal fitting (2) when said adapter engages the compact memory card.

13. The adapter for a memory card according to claim 1, comprising displacement control means (28, 37) preventing said hook portion (23) from being displaced in a direction apart from said core when the ends of said hook portion and said hook portion are connected to each other.

14. The adapter for a memory card according to claim 1, comprising an insulation coating film (60) formed on an entire outer surface of said frame metal fitting.

15. The adapter for a memory card according to claim 1, comprising an insulation coating film (60) formed on a periphery of an outer surface of said frame metal fitting.

16. The adapter for a memory card according to claim 1, comprising the compact memory card (4) in combination with said memory card adapter (1).

17. The adapter for a memory card according to claim 1, wherein the length of a longer memory card is a length of a normal-size memory card.

18. A method for using a shorter compact memory card (4) in a device adapted for a longer memory card, comprising:

providing a memory card adapter (1); and forming an assembly by connecting the compact memory card to the memory card adapter in such a way that the compact memory card and the memory card adapter lie in substantially a single plane, and wherein the assembly has a thickness, a width and a length of the longer memory card;

wherein said memory card adapter comprises:

a core (3) comprised of a resin molded body; and a frame metal fitting (2) assembled to said core; said frame metal fitting (2) including a pair of holding portions (21, 22) each having a substantially U-shaped configuration, in cross section across the insertion direction, and provided on opposite ends of said frame metal fitting at a memory-card attaching side thereof, to attach the compact memory card thereto; and a hook portion (23) provided between said pair of holding portions at said memory-card attaching side;

said holding portion being adapted to hold the opposite sides of an end of the compact memory card when the compact memory card is assembled with the memory card adapter;

said hook portion being adapted to detachably engage the end of the compact memory card by means of a first spring force so as to prevent said compact memory card from coming off the memory card adapter;

said frame metal fitting (2) further including caulking projections (24) which secure said frame metal fitting to said core by means of caulking onto said core;

whereby the assembly is usable in a device adapted to the longer memory card.

* * * * *